(12) United States Patent
Fu (10) Patent No.: US 7,372,339 B2
(45) Date of Patent: May 13, 2008

(54) PHASE LOCK LOOP INDICATOR (75) Inventor: Zhi Gang Fu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/321,768

(22) Filed: Dec. 28, 2005

(65) Prior Publication Data

US 2007/0120612 A1 May 31, 2007

(30) Foreign Application Priority Data

Nov. 29, 2005 (CN) .......................... 2005 1 0110860

(51) Int. Cl.
*H03L 7/095* (2006.01)
*H03L 7/087* (2006.01)

(52) U.S. Cl. ..................... 331/16; 331/11; 331/25; 331/DIG. 2; 327/157

(58) Field of Classification Search ................ 331/11, 331/16, 18, 25, 1 A, DIG. 2; 327/2, 5, 7, 327/156, 157
See application file for complete search history.

(56) References Cited

U.S. PATENT DOCUMENTS

| | | | | |
|---|---|---|---|---|
| 4,929,916 A | * | 5/1990 | Fukuda | .............. 331/1 A |
| 5,359,297 A | * | 10/1994 | Hodel et al. | .............. 331/1 A |
| 5,977,801 A | * | 11/1999 | Boerstler | .............. 327/7 |
| 6,329,882 B1 | | 12/2001 | Fayneh et al. | |
| 6,504,437 B1 | * | 1/2003 | Nelson et al. | .............. 331/14 |
| 6,744,323 B1 | * | 6/2004 | Moyal et al. | .............. 331/1 A |
| 6,762,631 B1 | | 7/2004 | Kumar | |
| 6,794,944 B2 | | 9/2004 | Hirai | |
| 6,829,318 B2 | * | 12/2004 | Kawahara | .............. 375/376 |
| 7,154,344 B2 | * | 12/2006 | Thies et al. | .............. 331/16 |

* cited by examiner

*Primary Examiner*—Benny T. Lee
*Assistant Examiner*—Ryan J Johnson
(74) *Attorney, Agent, or Firm*—Townsend and Townsend and Crew LLP (57) ABSTRACT

A phase-locked loop (PLL) circuit includes a power-on-reset (POR) to reset a digital block and set an initial input voltage value VCTRL of voltage-controlled oscillator (VCO). An input divider and a feedback divider are provided to set the frequency ratio of output to input and to raise the resolution of the output frequency. First and second phase frequency detectors are used to measure the phase difference between the two input signals and generate a pulse corresponding to the phase difference. First and second reducing dividers are inserted before the first and second phase frequency detectors to decrease the input frequency of the respective phase frequency detector and keep the ratio of the input frequency and natural frequency (Wn) as a constant. A lock-state detector is used to detect whether the PLL is locked or unlocked. A charge pump is used to provide charge signals corresponding to the pulse. A loop filter is coupled to the output node of the charge pump to provide a voltage VCTRL responding to the charge signals.

9 Claims, 8 Drawing Sheets

PHASE LOCK LOOP INDICATOR

CROSS-REFERENCES TO RELATED APPLICATIONS

This application claims priority to Chinese Application No. 200510110860.1; filed on Nov. 29, 2005; commonly assigned, and of which is hereby incorporated by reference for all purposes.

BACKGROUND OF THE INVENTION

The present invention relates to the field of integrated circuits technology, more particularly to phase-locked loops. Phase-locked loops (PLLs) are widely used in high performance digital systems. One application it is used is to multiply low frequency clock signals to high frequency clock signals with low jitter. With recent advances in the digital circuit technologies, more stringent performance requirements, including extremely low jitter, have been placed on PLLs. However, switching activities in digital system will introduce supply and substrate noises which will perturb the sensitive block in PLL. Any noise injected inside PLL contributes a source of jitter.

The loop bandwidth can be optimized according to the locking status to have a good control on the noise rejection from the input, power and ground, etc.

Figure 1:
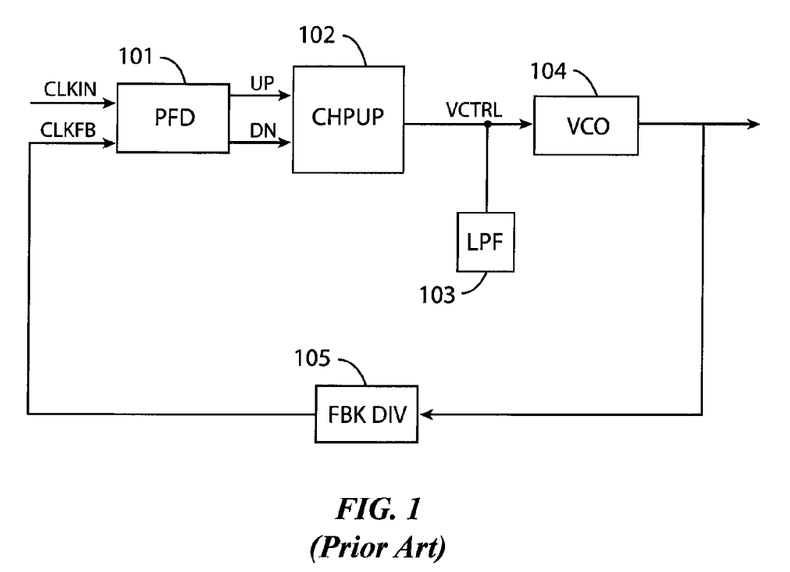
FIG. 1 shows the block diagrams of the general charge-pump phase-locked loop.

FIG. 1 shows the block diagrams of the general charge-pump phase-locked loop. Components 101, 102, 103, 104 and 105 are a phase frequency detector, charge-pump, loop filter, voltage controlled oscillator, and the feedback divider, respectively. CLKIN is provided to the first input of PFD 101. PFD provides a charging/discharging signal of UP/DN to CHPUP 102. The output of CHPUP is coupled to the loop filter 103 and to the VCO 104. The current from the CHPUP adjusts the frequency and the phase of VCO. The bias block generates the reference current, which is mostly used by the CHPUP. The output of the VCO is fed back to the input of the feedback divider 105. The output of the feedback divider is provided to the second input of PFD.

A charge-pump PLL is a negative feedback system. The phase and frequency difference between the two inputs to the PFD is near zero when PLL is in a steady state. Such a state is referred to "locked." Otherwise, the state is "unlocked."

Noise injection from the steady state leads to a transient response relating to the damping factor and the loop bandwidth of the loop system. Both the damping factor and the loop bandwidth have large effect on the loop stability, locking speed and the noise injection. The damping factor and loop bandwidth of the loop are function of physical quantities of the phase-frequency detector, the charge-pump current, the voltage-controlled oscillator gain and the feedback division value. Therefore the locking time is different under different settings.

Since the PLL is a second order system, there will be some overshoots and some undershoots in the transient response. These will worsen the jitter performance.

There are a number of different ways to detect the locked state of PLLs. According to one method, the maximum locking time is found. The maximum locking time generally is about 4 times the time constant of PLL. An off-chip stable capacitor is set so as to generate a delay that is substantially the same as the maximum locking time. Under another method, the clock cycle of the feedback signal is counted during consecutive test intervals defined by the reference signal. A feedback comparator determines whether the number of clock cycles of the feedback signal during a given test interval is within an expected range. Before lock is indicated, a qualification counter is either incremented or reset after each test interval in accordance with the expected range determination. A lock indication signal is provided if said qualification counter exceeds a qualification threshold. U.S. Pat. No. 6,794,944, which is incorporated by reference, discloses such a method. In yet another method, the locked state is detected by cycling back and forth and searching for the occurrence of an unlocked condition when the PLL is locked, and searching for the occurrence of a locked condition when the PLL is unlocked. U.S. Pat. No. 6,762,631, which is incorporated by reference, discloses such a method.

Similar to the lock detection, there are a number of different ways to optimize the bandwidth. According to one method, the bandwidth is selected to be about ½₀ of the reference frequency. According to another method, self-Bias circuits that keep the ratio of the Wref (reference frequency) and Wb (loop bandwidth) constant and independent to the process. U.S. Pat. No. 6,329,882, which is incorporated by reference, discloses such a method. IN yet another method, two configurations are provided. The bandwidth is increased in the first configuration, and decreased in the second configuration. U.S. Pat. No. 6,504,437, which is incorporated by reference, discloses such a method.

BRIEF SUMMARY OF THE INVENTION

The present invention relates to PLLs. One embodiment of the present invention provides a method for realizing the function of lock detection that makes it easier to have a good control on the loop bandwidth. The present embodiment improves the locking speed and jitter performance of phase-locked loops.

The present embodiment provides one or more of the following advantages: (1) makes it easy to know when the phase-locked loop is locked, (2) makes the phase-locked loop be locked faster, and (3) makes the phase-locked loop be very stable with ultra high jitter performance after it has been locked.

Figure 2:
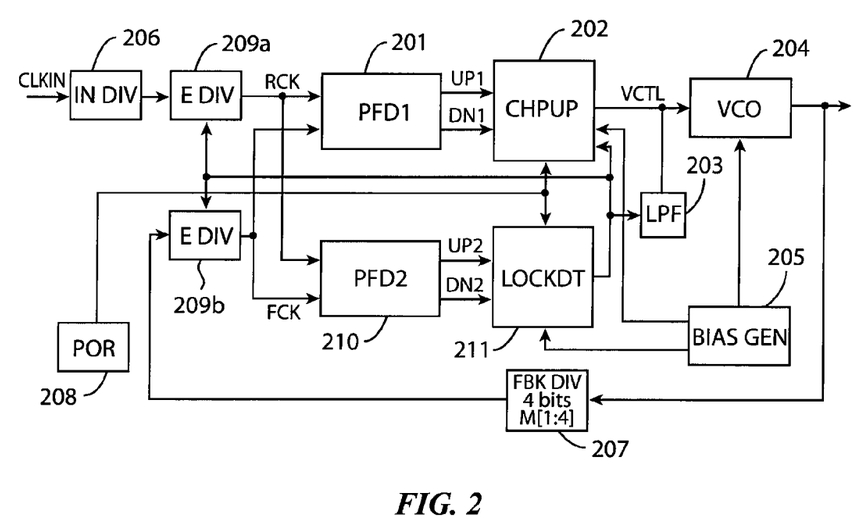
FIG. 2 is a functional block diagram of one embodiment of the present invention.

According to one embodiment, a phase locked loop comprises an input reference clock which is applied to the phase frequency detector and compared with a divided quotient signal which is proportional to the output of the voltage controlled oscillator. The continuous three comparisons of the phase differences are provided to the LOCKDT (FIG. 2, numeral 211). Then LOCKDT indicates the PLL has been locked by outputting an appropriate signal. The output of the LOCKDT is used to control the E DIV (FIG. 2, numeral 209) in bypass or divider mode. This helps to further decrease the input reference frequency, suppress the noise from the input and makes this time the start point when the phase locked loop is switched to a second state with an "ultra" narrow bandwidth.

In one embodiment, a phase-locked loop (PLL) circuit includes a power-on-reset (POR) to reset digital block and set an initial input voltage value VCTRL of voltage-controlled oscillator (VCO). An input divider and a feedback divider are provided to set the frequency ratio of output to input and to raise the resolution of the output frequency. First and second phase frequency detectors are used to measure the phase difference between the two input signals and generate a pulse corresponding to the phase difference. First and second reducing dividers are inserted before the first and second phase frequency detectors to decrease the input frequency of the respective phase frequency detector and keep the ratio of the input frequency and natural frequency (Wn) as a constant. A lock-state detector is used to detect whether the PLL is locked or unlocked. A charge pump is used to provide charge signals corresponding to the pulse. A loop filter is coupled to the output node of the charge pump to provide a voltage VCTRL responding to the charge signals.

The lock detector comprise a phase detector (PFDT) to measure a phase offset between first and second inputs received from the second phase frequency detector and convert the phase offset to a given voltage and output a logic signal (RESULTX) corresponding to the given voltage. A clock generating circuit including an NOR gate that receives outputs from the second phase frequency detectors and outputs an internal clock signal. A sampler samples a plurality (e.g., three) of the logic signals using the internal clock. A re-sampler to sample the plurality of logic signals and output a plurality of re-sampled signals, where the re-sampled signals are compared to output a lock-indicating signal that indicates the lock state of the PLL. The re-sampled signals are compared using a NOR gate.

The second phase frequency detector includes a reset delay having a delay length is longer than the shortest sampling time of the sampler. The loop filter includes a plurality of capacitors, wherein one of the capacitor is used to suppress a high frequency noise from the charge signal of the charge pump. A current bias generator is coupled to the charge pump to decrease a charging/discharging current associated with the charge pump. The loop filter includes a switch to switch the PLL circuit to a high loop bandwidth mode once the lock detector indicating the PLL is in a locked state

DETAILED DESCRIPTION OF THE INVENTION

FIG. 2 is a functional block diagram of one embodiment of the present invention. A phase frequency detector 201, a charge-pump 202, loop filter 203, voltage controlled oscillator (VCO) 204, an input divider 206 and a feedback divider 207 are provided. The input divider provides a reference clock/signal. The first phase frequency detector 201 outputs signals UP1 (or high signal) or DN1 (or low signal) to the charge pump 202, which outputs to VCO 204. A second phase frequency detector 210 that has a different delay than that of the first phase frequency detector 201 is provided. In the present implementation, the second frequency detector has a greater delay than the first frequency detector 201. The delay is used to hold sample data.

A lock-state detector 211 is also provided to receive outputs signals UP2 (or high signal) and DN 2 (or low signal) from the second phase frequency detector 210. A current generator (or bias generator) 205 provides a reference current for the charge-pump and the voltage-controlled oscillator. A power-on-reset 208 resets the digital block and sets an initial value for the input of the voltage-controlled oscillator via the charge-pump and lock-state detector. The power-on-reset 208 sets an initial value to increase the locking speed. The initial value is set to be between V1 and V2, where f(V1)=f1, and f(V2)=f2. The linear range of the voltage-controlled oscillator 204 is from f1 to f2. The voltage-controlled oscillator 204 has a gain of Kv (Mhz/V). Therefore the output frequency range is from f1 to f1+Kv (V2−V1).

First and second reducing dividers 209a and 209b are provided before the phase frequency detectors. These dividers are used to minimize or reduce the reference frequency and suppress the input noise. The first divider 209a receives the reference current from the input divider and inputs a reference clock/signal RCK to the first and second phase frequency detectors. The second divider 209b receives the feedback signal from the feedback divider 207 and inputs a feedback clock/signal FCK to the first and second phase frequency detectors.

Figure 3:
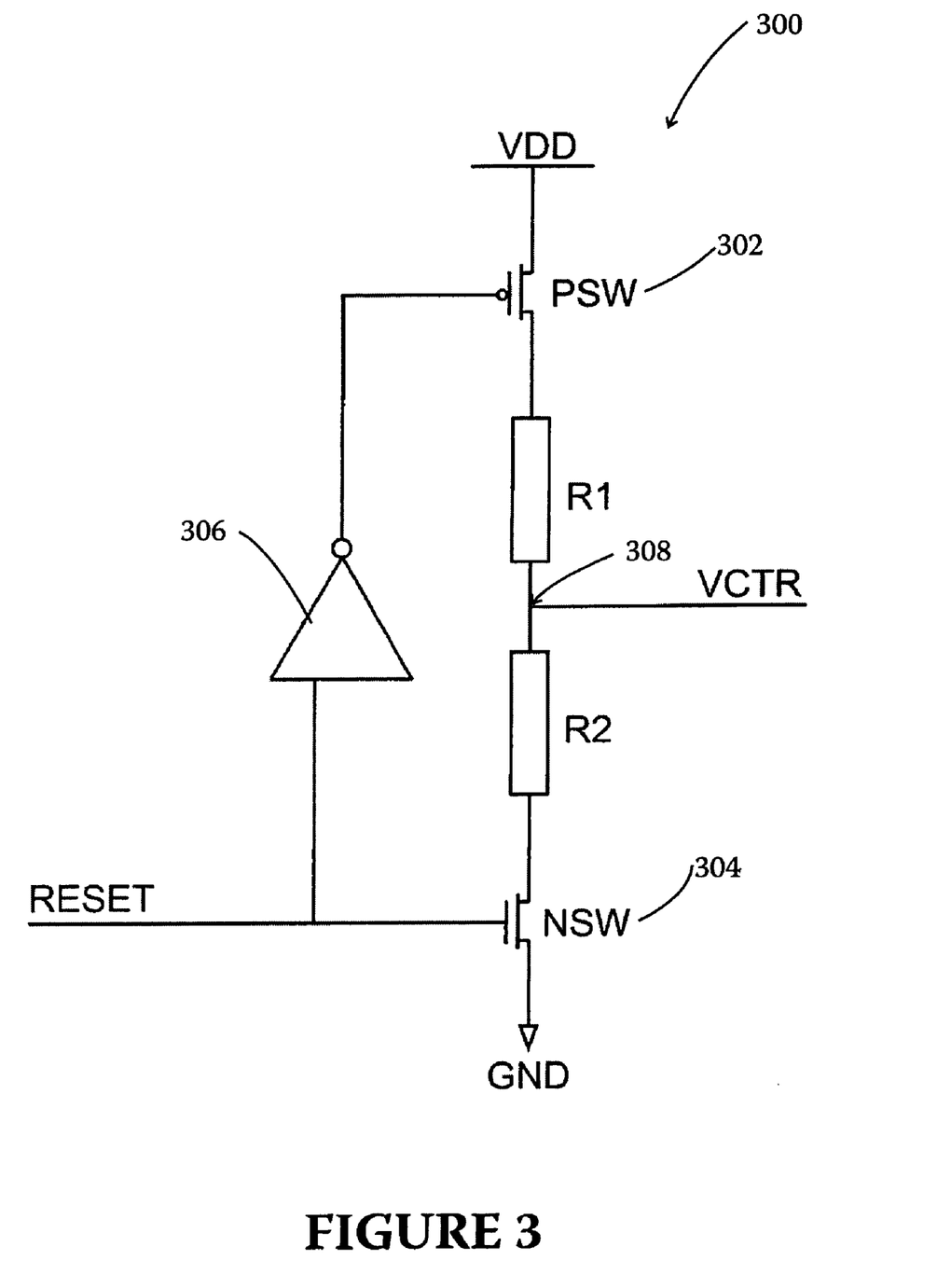
FIG. 3 is a charge pump according to one embodiment of the present invention.

FIG. 3 is a circuit 300 that is part of a charge pump (CHPUP) 300 that corresponds to CHPUP 202. CHPUP 300 includes an upper transistor 302, a lower transistor 304, a first resister R1, a second resister R2, an inverter 306. An output node 308 is provided between the two resisters R1 and R2 and outputs VCTR. The ratio of R1 and R2 is set as follows: VCTR=(V1+V2)/2=(R2*VDD)/(R1+R2), where VDD represents the value of the power. If the phase-locked loop is customized for a fixed output frequency, the value Vf of VCTR may be found when loop is stabilized after being locked. Then an initial value of VCTR can be set as being equal to Vf, with relation to R1/R2 as follows: VCTR=Vf=(R2*VDD)/(R1+R2). This shortens the locking time significantly.

Figure 4:
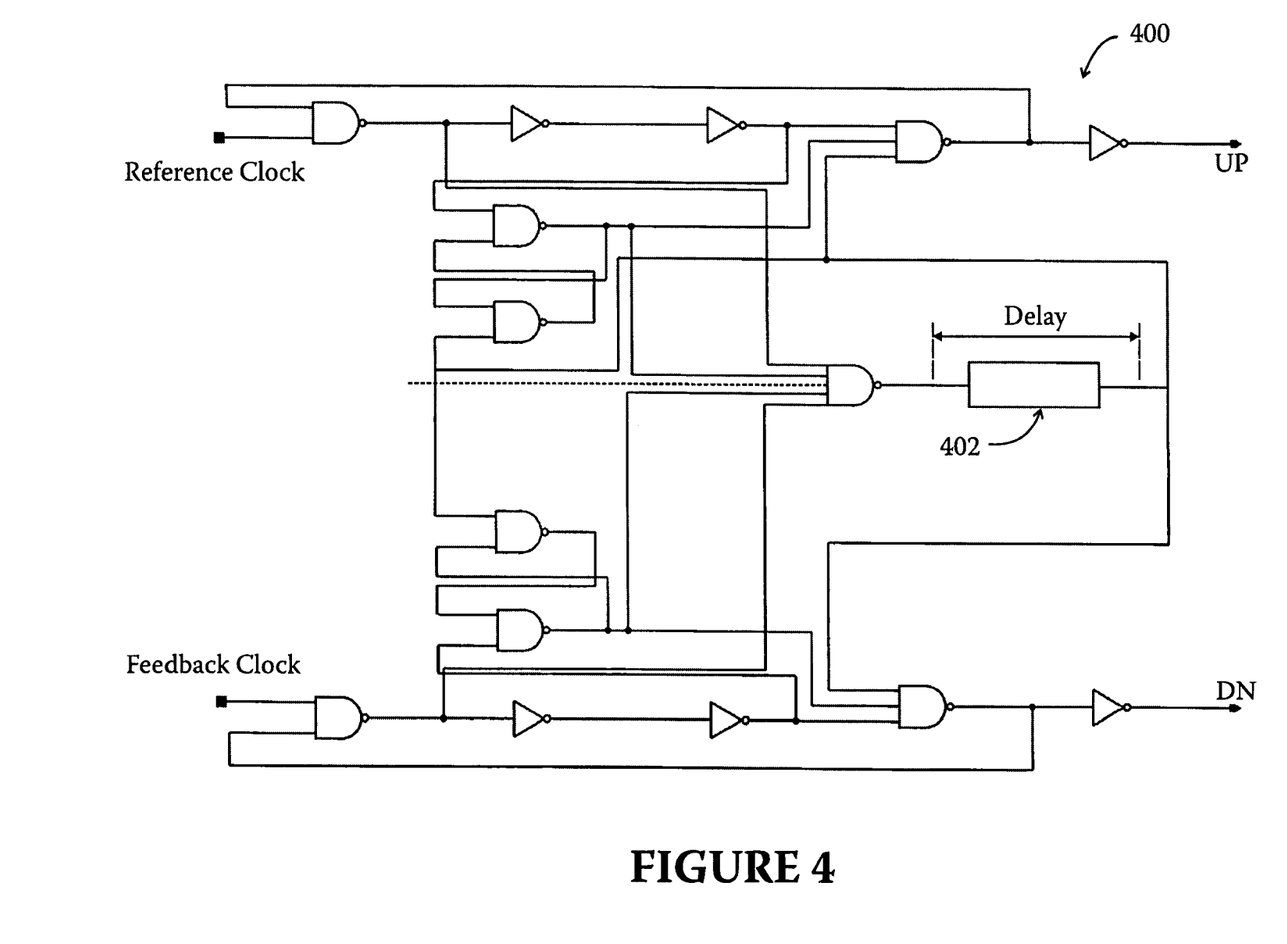
FIG. 4 illustrates an exemplary phase frequency detector according to one embodiment of the present invention.

FIG. 4 illustrates an exemplary phase frequency detector 400 according to one embodiment of the present invention. Phase frequency detector 400 corresponds to the detectors 201 and 210 in FIG. 2. A delay cell 402 is included in the detector 400. A different delay cell is provided for each of detectors 201 and 210 in the present implementation. Generally in the phase frequency detector, the delay is used to hold sample data and avoid the dead-zone. The dead-zone occurs when the loop does not respond to small phase errors. For instance, for 10 ps phase errors at the inputs, the phase frequency detector finds it difficult to generate 10 ps wide charging/discharging pulses; also charge pump switches may have difficulty turning on and off in 10 ps. Accordingly, a delay is set before the reset in the phase frequency detector to guarantee the minimum pulse width, which is typically 150 ps or so. The width should not be set too large because the current mismatching causes a pattern jitter. Since the detector 210 is not in the loop, its reset delay has no effect on the output jitter. The delay inside can be set bigger than a value needed for LOCKDT. This delay is referred to as "Tld."

Figure 5:
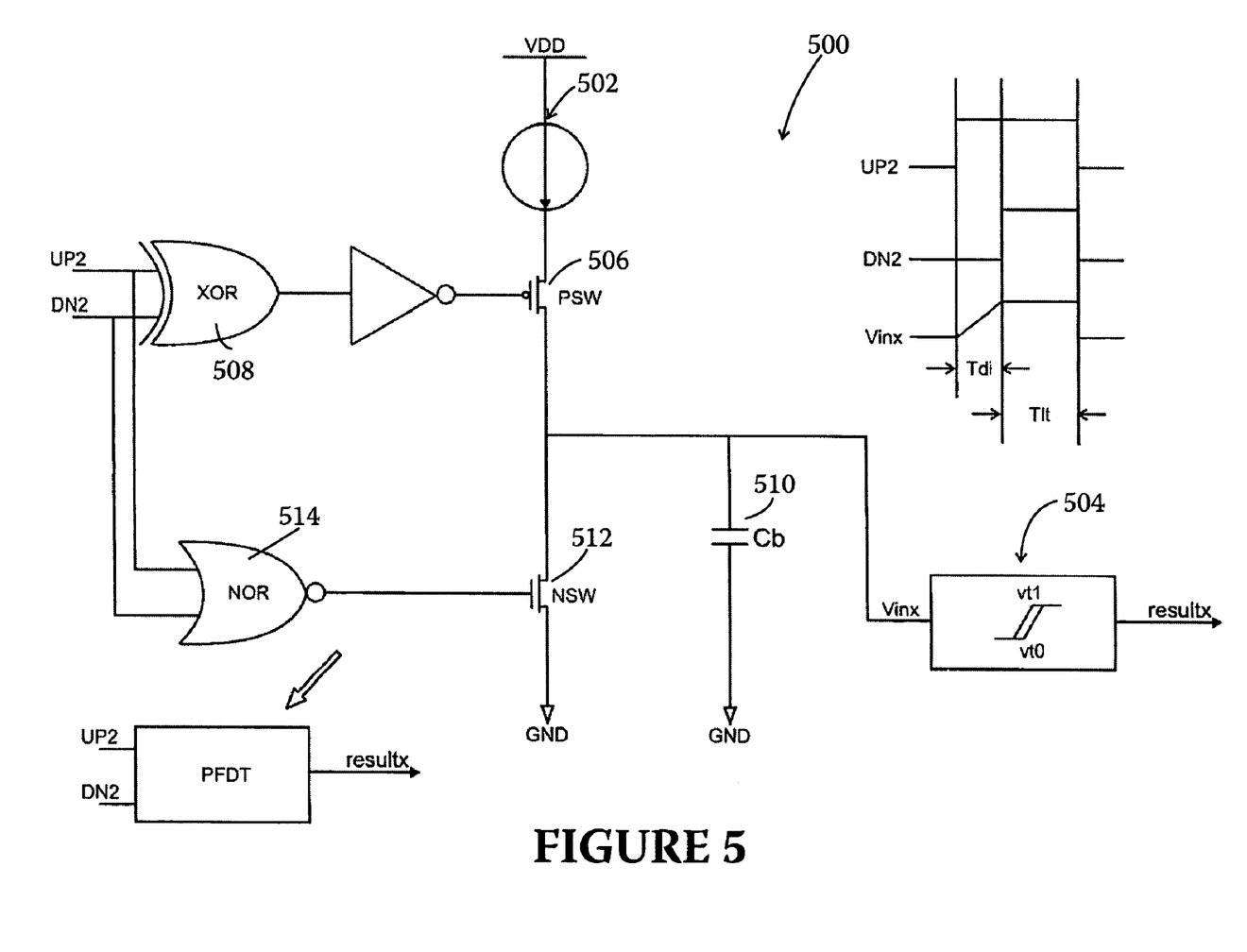
FIG. 5 illustrates a comparator that is used to compare with the inputs UP2 and DN2 during a given clock cycle of a reference clock of the phase detector.
Figure 6:
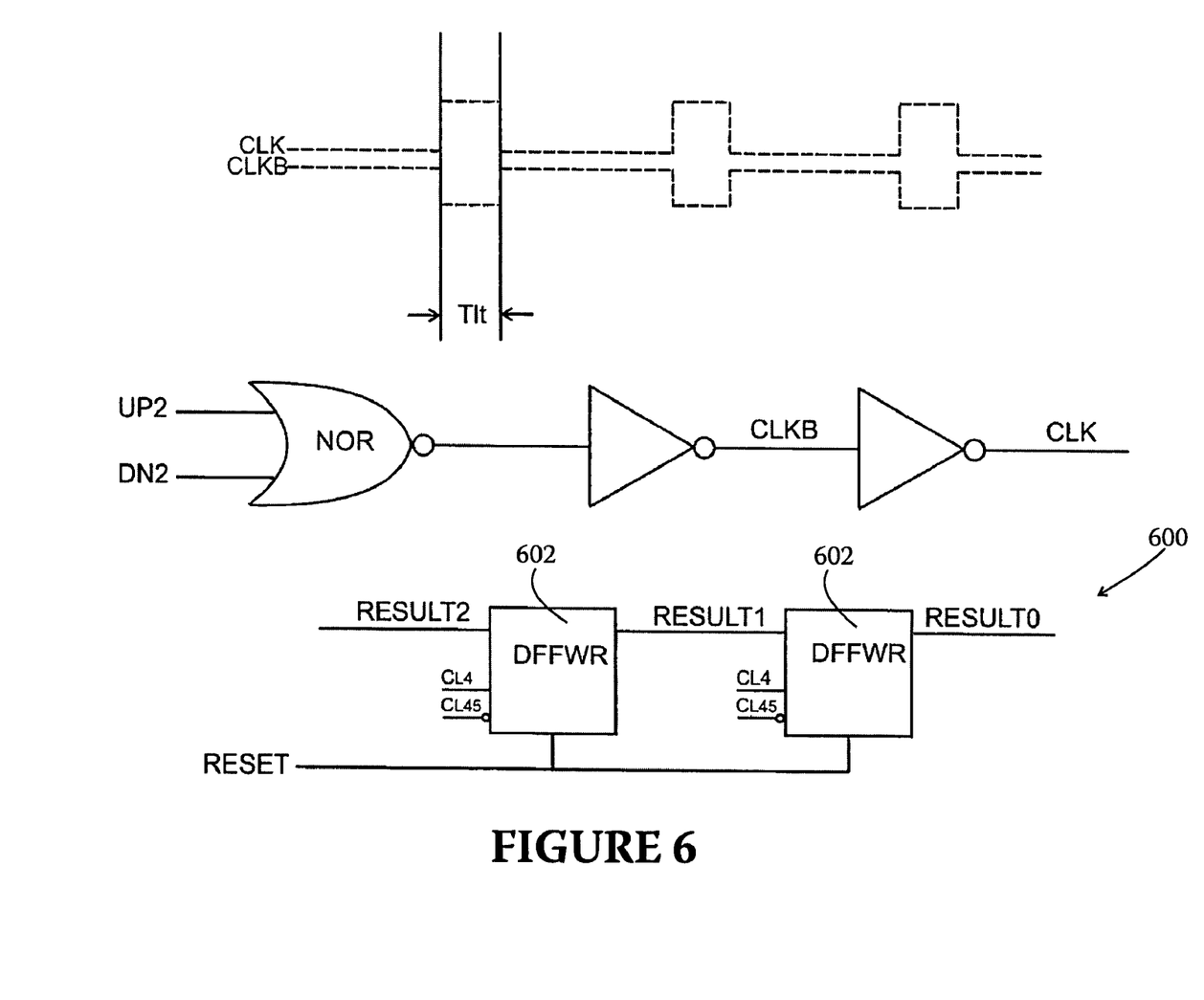
FIG. 6 illustrates a sampler that samples the output RESULTX from the comparator for a given number of continuous clock cycles according to one embodiment of the present invention.
Figure 7:
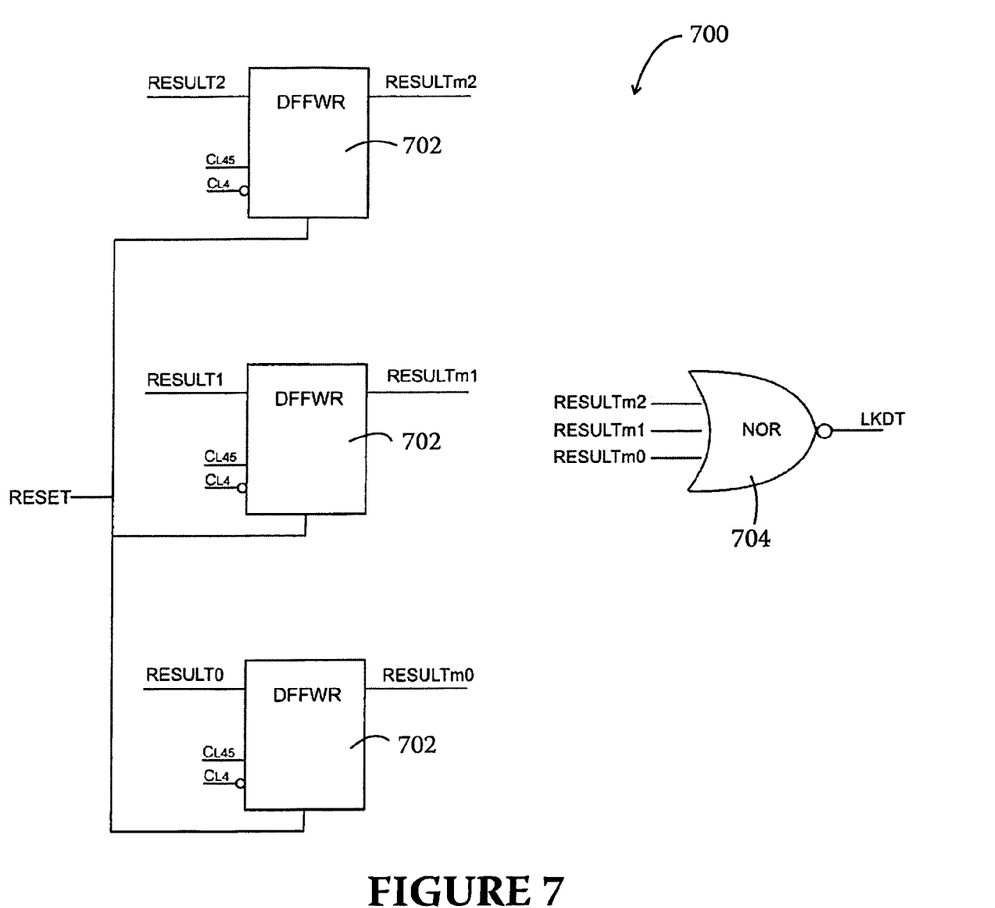
FIG. 7 illustrates a re-sampler used to compare the three outputs of the sampler in FIG. 6.

FIGS. 5-7 illustrate various blocks within a lock-state detector according to one embodiment of the present invention. The lock-state detector (or locking indicator) compares the two inputs UP2 and DN2 from the second phase frequency detector to determine the loop condition, e.g., whether or not the stated is "locked" or "unlocked."

FIG. 5 illustrates a comparator (phase detector) 500 that is used to compare with the inputs UP2 and DN2 during a given clock cycle of a reference clock of the phase detector. A current source 502 provides a reference current. A Schmitt Trigger 504 is configured to output HIGH when input is higher than Vt1 and output LOW when input is lower than Vt0. Any input between Vt0 and Vt1 does not affect the Schmitt Trigger's output. A first switch 506 is controlled by the output of an XOR gate 508. When the inputs UP2 and DN2 are in different logic levels, the first switch is ON and charges a capacitor 510 with the reference current Ib. A second switch 512 is controlled by output of a NOR gate 514. The second switch is OFF when either of the inputs UP2 and DN2 is HIGH.

In operation, if a PLL is designed with a maximum tracking jitter (Tj), then the loop is locked when the phase difference between the two inputs to the phase detector is no more than Tj. Otherwise the loop is unlocked. The reference current and capacitor Cb can be calculated as follows: Vt0=Ib*Tj/Cb.

When the inputs UP2 and DN2 are both LOW, the first switch is OFF. The capacitor does not receive current. But at the same time, the second switch is ON, which discharges the capacitor and keeps a signal Vinx in LOW. As a result, the output of the Smith Trigger is LOW. When one of the inputs UP2 and DN2 is HIGH, the second switch is OFF, and the first switch is ON, the capacitor is charged. When both of the inputs UP2 DN2 are HIGH, both of the switches are OFF for a fixed interval Tlt. The signal Vinx remains at a given value during this fixed time, which provides Smith Trigger with enough time to output LOW or HIGH. After the reset, the inputs UP2 and DN2 are LOW, which turns on the second switch. As a result, the signal Vinx goes LOW. PFDT goes to the next clock cycle.

FIG. 6 illustrates a sampler 600 that samples the output RESULTX from the comparator 500 for a given number of continuous clock cycles according to one embodiment of the present invention. That is, the first sampled RESULT0 is replaced with RESULT1, which is replaced with RESULT2, which is replaced with RESULT3, and so on, with respect to a plurality of flip-flops 602 (or D flip flop with reset). The clock used for the sampler is not a fixed period "clock" since its period is not constant before the loop is locked. The fixed interval Tlt, which is a reset delay, is sufficiently long to send the RESULTX to the next flip flop.

FIG. 7 illustrates a re-sampler 700 used to compare the three outputs of the sampler 600 in FIG. 6. The re-sampler 700 includes a plurality of flip flops 702 that receive the outputs from the sampler 600. These outputs are re-sampled with an inversed clock by the flip flips 702, which in turn output RESULTm0, RESULTm1, and RESULm2 that are provided as the input of a three-input NOR gate 704. When all there inputs are LOW, the NOR gate outputs HIGH and the PLL is deemed to be locked.

Figure 8:
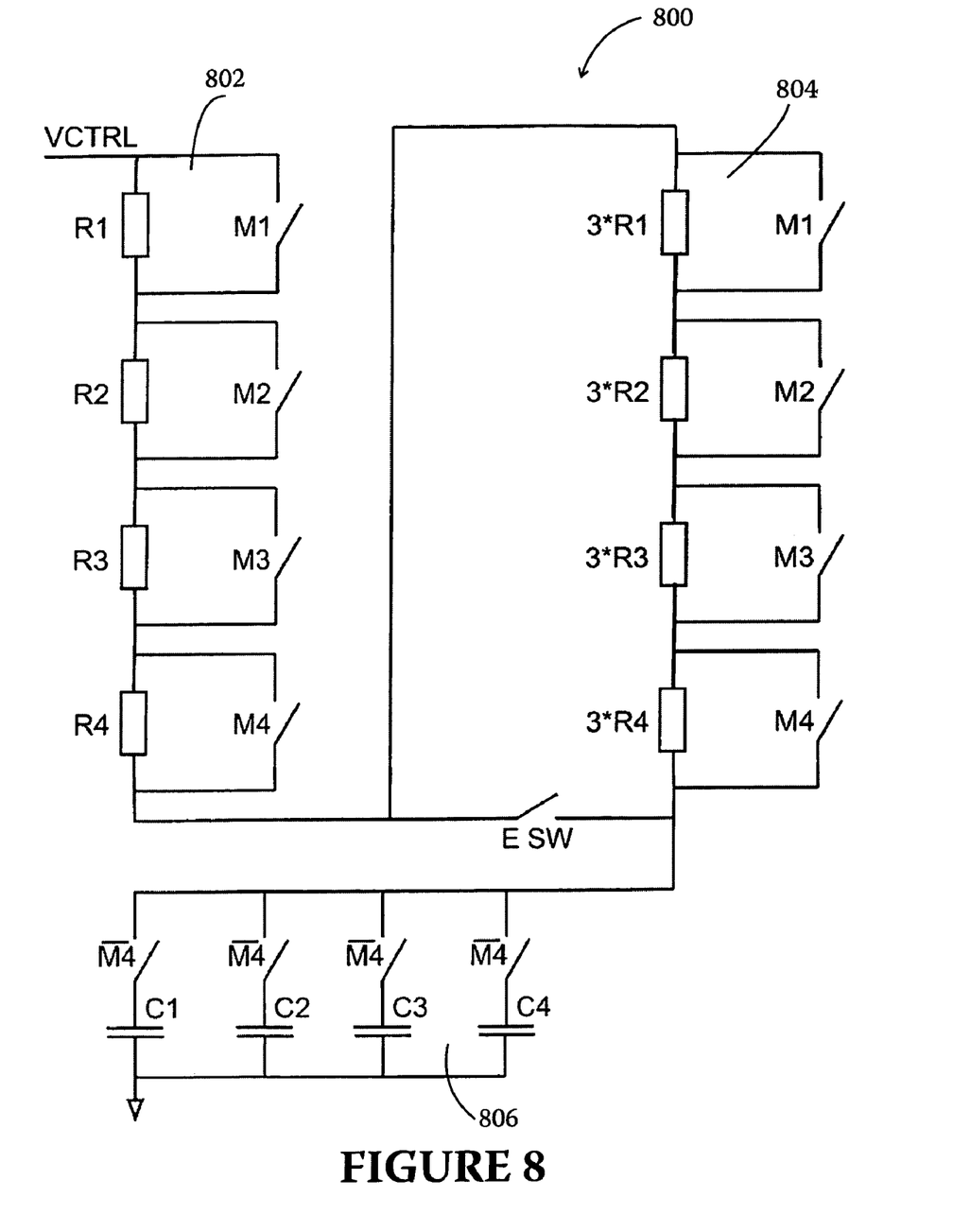
FIG. 8 illustrates a loop filter according to one embodiment of the present invention.

FIG. 8 illustrates a loop filter 800 according to one embodiment of the present invention. M [1:4] are inputs to the feedback divider 207 and are used to control the resistance R and capacitance C. The loop filter includes a plurality of first blocks 802 that are in series. Each block 802 includes a resistor and a switch. A plurality of blocks 804 are provided in series as well. Each block 804 includes a resister and a switch. To adjust the resistance value the switches are turned on or off. A plurality of blocks 806 are provided to adjust the capacitance. Each block 806 includes a capacitor and a switch. The switch is turned on or off to adjust the capacitance.

Figure 9:
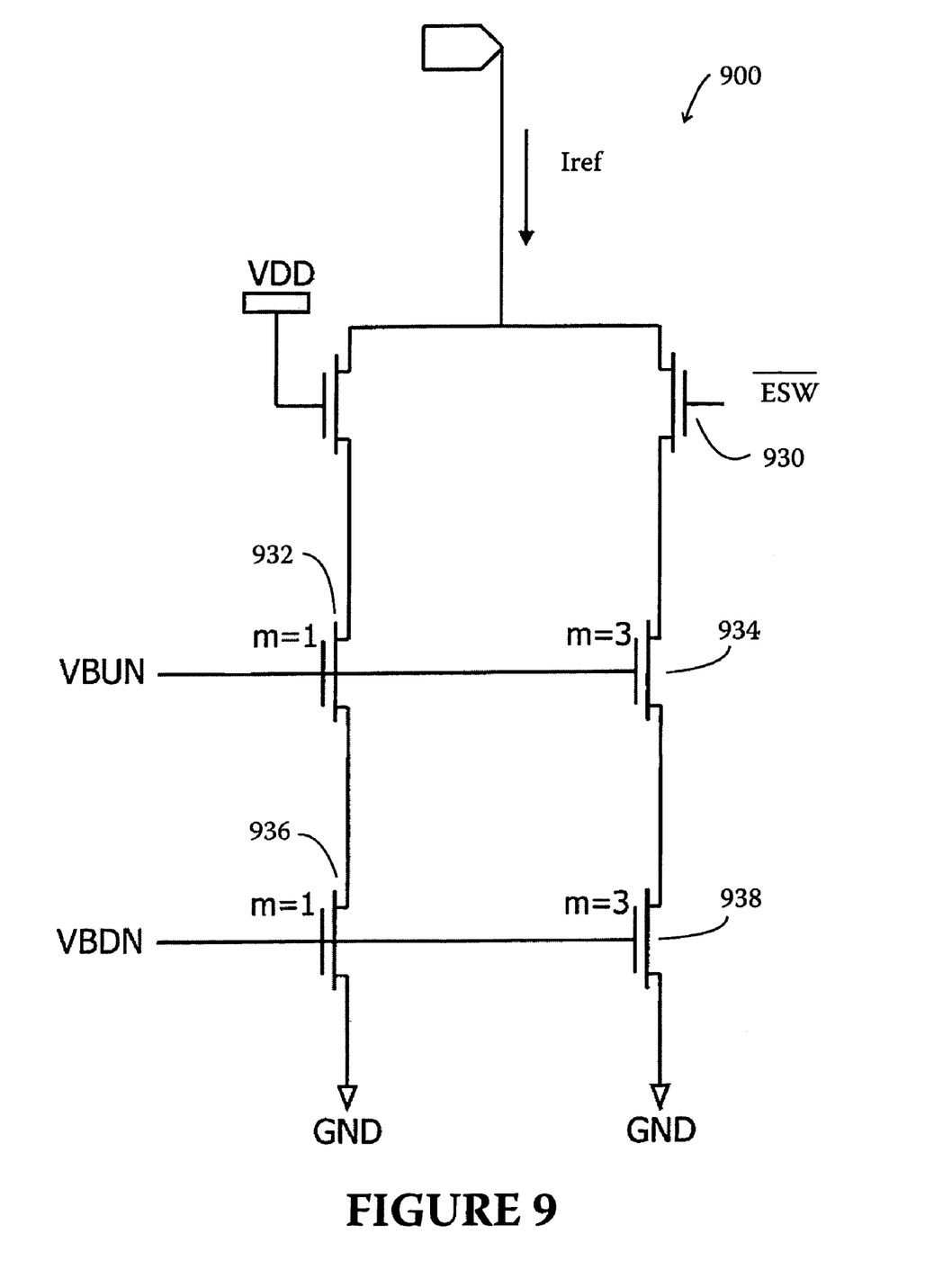
FIG. 9 illustrates a current bias controller according to one embodiment of the present invention.

FIG. 9 illustrates a current bias controller 900 according to one embodiment of the present invention. A switch 930 is controlled by the outputs of the lock-state detector that output LKDT. A plurality of switches 932 and 934 receive the input VBUN and a plurality of switches 936 and 938 receives the input VBDN. Using this method, it is possible to provide a constant R*C based on difference M settings, Where:

$$R4=2*R3=4*R2=8*R1;$$

$$C4=2*C3=4*C2=8*C1;$$

In operation when LKDT is LOW (i.e., the loop is unlocked), the switch 930 is closed and R=Ru. When LKDT is HIGH (, i.e., the loop is locked), the switch 930 is open and R=4Ru. The capacitance remains the same.

The damping factor $\zeta$ impacts the loop stability and should preferably be kept constant. The damping factor is defined as, $$\zeta = \frac{1}{2}R\sqrt{\frac{Ip \times Kv \times Cp}{M}}$$

Where

Ip represents the charging/discharging current in CHPUP

Kv represents the gain of the voltage-controlled oscillator

Cp represents the capacitor in loop filter

M represents the feedback divider's value.

When the switch 930 is open, the value of R is increased four times. As a result, the damping factor is increased four times. To keep the damping factor constant, the current Ip is set four times smaller and the feedback divider M four times larger.

The natural frequency $$\left(wn = \sqrt{\frac{Ip \times Kv}{M \times Cp}}\right)$$

also plays an important role on the loop stability and other performance like jitter performance parameter. Under certain circumstances, the loop needs at least 4 times (1/ζ wn) to get locked. The locking time becomes long if the natural frequency Wn is set too large. On the other hand, the loop may become unstable if the natural frequency Wn is set too small. Generally, a narrow bandwidth improves the noise injection. The natural frequency Wn is set to be about ½0 of the input reference frequency (Wref) to phase frequency detector according to one implementation. The ratio of Wref and Wn should be kept constant at first and then decrease the natural frequency Wn, as needed. Increasing the current Ip increases the gain of the loop and worsens the loop performance.

In present embodiment, after the loop is locked a divider (see numeral 209 in FIG. 2) is enabled. The divider 209 is inserted before the two inputs of the phase detector. Therefore the value of the feeback divider is increased by four times. In FIG. 9, the reference current source Iref is decreased by four times. After such operation, the damping factor $\zeta$ is kept constant, the natural frequency Wn decreases to ¼ of previous value, and ratio of Wref/Wn remains the same.

The present invention has been described in terms of specific embodiments. As will be understood by those skilled in the art, the embodiment disclosed above may be altered or modified without departing from the scope of the present invention. The scope of the invention should be interpreted using the appended claims.

What is claimed is:

1. A phase-locked loop (PLL) circuit, comprising:
   first and second phase frequency detectors, each configured to receive a reference signal and a feedback signal, the second phase frequency detector being configured to have a greater delay than the first phase frequency detector in order to hold sample data;
   a first reducing divider configured to provide the reference signal to the first and second phase frequency detectors;
   a second reducing divider configured to provide the feedback signal the first and second phase frequency detectors;
   a charge-pump configured to receive first and second control signals output by the first phase frequency detector;
   a lock-state detector configured to receive third and fourth control signals output by the second phase frequency detector;
   a voltage control oscillator configured to receive a voltage control signal output by the charge pump and provide an output signal; and
   a feedback divider configured to receive the output signal and provide the feedback signal to the second reducing divider.

2. The PLL circuit of claim 1, further comprising:
   an input divider configured to provide an input to the first reducing divider, wherein the input divider cooperates with the feedback divider to set a frequency ratio of output to input.

3. The PLL circuit of claim 1, further comprising:
   a power-on-reset configured to set an initial value for the voltage-controller oscillator.

4. The PLL circuit of claim 1, wherein the first and second phase frequency detectors includes first and second delay circuits that have different delay values.

5. The PLL circuit of claim 1, further comprising:
   a loop filter coupled to an output node of the charge-pump and being configured to adjust a loop resistance.

6. The PLL circuit of claim 1, wherein the first and second control signals are a first UP signal and a first DN signal, respectively, and the third and fourth control signals are second UP signal and a second DN signal, respectively.

7. A phase-locked loop (PLL) circuit, comprising:
   first and second phase frequency detectors, each configured to receive a reference signal and a feedback signal;
   a first reducing divider configured to provide the reference signal to the first and second phase frequency detectors;
   a second reducing divider configured to provide the feedback signal the first and second phase frequency detectors;
   a charge-pump configured to receive first and second control signals output by the first phase frequency detector;
   a lock-state detector configured to receive third and fourth control signals output by the second phase frequency detector;
   a voltage control oscillator configured to receive a voltage control signal output by the charge pump and provide an output signal; and
   a feedback divider configured to receive the output signal and provide the feedback signal to the second reducing divider,
   wherein the lock detector comprises:
   a phase detector to measure a phase offset between first and second inputs received from the second phase frequency detector and convert the phase offset to a given voltage and output a logic signal corresponding to the given voltage;
   a clock generating circuit including an NOR gate that receives outputs from the second phase frequency detectors and outputs an internal clock signal;
   a sampler to sample a plurality of the logic signals using the internal clock;
   a re-sampler to sample the plurality of logic signals and output a plurality of re-sampled signals, wherein the re-sampled signals are compared to output a lock-indicating signal that indicates the lock state of the PLL.

8. The PLL circuit of claim 7, wherein the re-sampled signals are compared using a NOR gate.

9. The PLL circuit of claim 7, wherein the second phase frequency detector includes a reset delay having a delay length is longer than the shortest sampling time of the sampler.

* * * * *